US008837148B2

(12) United States Patent
Giovannelli et al.

(10) Patent No.: US 8,837,148 B2
(45) Date of Patent: Sep. 16, 2014

(54) DEVICE FOR SUPPORTING, HOUSING AND COOLING RADIANT MODULES OF AN ANTENNA, PARTICULARLY ARRAY ANTENNA

(75) Inventors: Andrea Giovannelli, Rome (IT); Francesca Masala, Rome (IT)

(73) Assignee: Selex Sistemi Integrati S.p.A. P.A., Rome (IT)

( * ) Notice: Subject to any disclaimer, the term of this patent is extended or adjusted under 35 U.S.C. 154(b) by 869 days.

(21) Appl. No.: 12/737,286

(22) PCT Filed: Jul. 18, 2008

(86) PCT No.: PCT/IT2008/000485
§ 371 (c)(1), (2), (4) Date: Apr. 5, 2011

(87) PCT Pub. No.: WO2010/007637
PCT Pub. Date: Jan. 21, 2010

(65) Prior Publication Data

US 2011/0279343 A1 Nov. 17, 2011

(51) Int. Cl.

| | |
|---|---|
| ***H05K 7/20*** | (2006.01) |
| ***H01Q 1/12*** | (2006.01) |
| ***H01Q 1/02*** | (2006.01) |
| ***H01Q 21/00*** | (2006.01) |

(52) U.S. Cl.
CPC ............. *H01Q 1/02* (2013.01); *H01Q 21/0087* (2013.01); *H01Q 21/0025* (2013.01)
USPC ........... 361/702; 361/699; 361/704; 361/716; 165/104.33; 165/185; 343/878

(58) Field of Classification Search
USPC .................. 361/699, 702, 704, 716; 343/878; 165/104.33, 185
See application file for complete search history.

(56) References Cited

U.S. PATENT DOCUMENTS 5,431,582 A * 7/1995 Carvalho et al. .............. 439/372
5,457,607 A * 10/1995 Carvalho ...................... 361/740
(Continued)

FOREIGN PATENT DOCUMENTS

EP 0 318 309 A 5/1989
EP 653801 A1 * 5/1995 ............. H01Q 21/00
(Continued)

OTHER PUBLICATIONS

PCT Search Report Dated Jun. 12, 2009.

*Primary Examiner* — Robert J Hoffberg
(74) *Attorney, Agent, or Firm* — Hedman & Costigan, P.C.; James V. Costigan; Kathleen A. Costigan

(57) ABSTRACT

The present invention relates to a device (1) for supporting, housing and cooling radiant modules (2) of an antenna, comprising a plate (3) for cooling said radiant modules (2) that can be fixed to means for supporting said antenna, said plate (3) having an upper surface and a lower surface; characterized in that it comprises a plurality of projecting guides (5) provided at least on one of said surfaces of said plate (3), so that each pair of said projecting guides (5) adjacent with surface on which are provided realize housing seats (6), in each one of which one of said radiant modules (2) is introduced; and pressing means (7, 15, 16, 17), integrated with said projecting guides (5), apt exerting a pressure on said radiant modules (2) so as to obtain a substantially uniform coupling between each of them and the surface of said plate (3) on which said projecting guides (5) are provided. The invention further relates to an array antenna.

15 Claims, 8 Drawing Sheets

(56) References Cited

U.S. PATENT DOCUMENTS

| | | | | |
|---|---|---|---|---|
| 6,469,671 | B1 | 10/2002 | Pluymers et al. | |
| 6,611,430 | B1 | 8/2003 | Richard et al. | |
| 7,227,753 | B2 * | 6/2007 | Weber et al. | 361/700 |
| 7,548,424 | B2 * | 6/2009 | Altman et al. | 361/699 |
| 2012/0218149 | A1 * | 8/2012 | Edward et al. | 342/368 |
| 2013/0183913 | A1 * | 7/2013 | Tevell et al. | 455/90.3 |

FOREIGN PATENT DOCUMENTS

| | | | | |
|---|---|---|---|---|
| EP | 2308129 | B1 * | 2/2012 | H01Q 1/02 |
| JP | 2006-278430 | A | 10/2006 | |

* cited by examiner

DEVICE FOR SUPPORTING, HOUSING AND COOLING RADIANT MODULES OF AN ANTENNA, PARTICULARLY ARRAY ANTENNA

The present invention relates to a device for supporting, housing and cooling radiant modules of an antenna, particularly an array antenna.

More specifically, the invention concerns a device of the above kind, particularly studied and realized for permitting a high "packing" of radiant modules and at the same time easing access to the same thus permitting an easy maintenance.

As it is well known, radar array antenna technology is diffused in different sectors of tele-detection.

Array antennas are comprised of an assembly of radiant modules, which are generally all the same, provided along a line or a plane, equally-oriented and each supplied with different amplitudes and phases.

Advantage of using the above technology is that of obtaining a configurable radiation diagram, varying amplitude and phases of signals supplying single modules comprising the antenna. Moreover, it is possible designing an array antenna in order to obtain polar diagrams with main lobes and zeros in the wished positions.

Programmable array antennas exist, able modifying their radiation diagram varying supply of radiant modules comprising the same.

The use of the array antennas is diffused in spatial applications, in radars and all applications wherein it is necessary a high emission of power.

Array antennas employed for radar permit reaching maximum operative efficiency when radiant modules are as closer as possible. However, radiant modules tendon dissipating much heat and difficulties for cooling would arise installing them very close each other.

In order to place radiant modules as closer as possible and at the same time permitting a suitable dissipation of generated heat, support devices, also known as "cold plate" are presently employed in this sector permitting both housing and cooling radiant modules. Said devices have a substantially planar structure permitting housing a plurality of radiant modules thus creating a line of the array antenna. A plurality of said devices creates a planar array antenna. Each one of them is fixed to a support structure. Placing said devices one above the other. Channels are provided within said devices, wherein a pump makes the cooling liquid flowing.

Main limit to the housing of said radiant modules is due to the need of permitting a quick replacement of one or more radiant modules in case of failure.

In fact, until today, in case of failure of one or more radiant modules, most common solutions oblige operator withdrawing all the support module or "cold plate" in order to replace even a single module. It requires a long time and involves a high risk of damaging the whole assembly.

Furthermore, in order to permit the above maintenance operations, it is necessary keeping said support devices at a distance each other sufficient to permit to the operator withdrawal operations.

Different solutions are known today to solve the above problem. For example, U.S. Pat. No. 5,431,582 concerns an apparatus for housing radiant modules for radar antennas. Each module comprises a tubular assembly at one end of a helicoidal groove, and on the other end means suitable to permit coupling of a tool.

Said apparatus also comprises a pin, which is integral with the cooling element, on which said tubular element can be assembled, so that, following rotation of the latter by said tool, said pin enters within the helicoidal groove. It implies a linear translation of module into two distinct orthogonal directions, so as to maintain the module within the housing.

As it can easily understood, optimization of the module with cooling element is obtained mechanically, by engagement of an element with a tubular groove with a pin. A limit of this solution is that coupling pressure between transceiving module and cooling surface of support device is not optimum and is not uniform, being it possible adjusting the same only by the operator using said tool.

A second known solution is described in U.S. Pat. No. 4,998,181, concerning a cooling, positioning and support system for array antenna microwave modules, comprising a housing, with a set length, provided with an inner region and a lateral region, said lateral region including said inner region. Seats are provided in said inner region, wherein said modules can be introduced.

Said system further comprises an inlet path for the cooling fluid and an outlet path. System can permit introduction and withdrawal of microwave modules (preferably with a matrix arrangement) into suitable housing seats independently each other. Solution also permits sending cooling liquid in an optimum way.

However, above solution has no structure suitable to exert a pressure on modules so as to ensure their coupling with support and cooling device.

U.S. Pat. No. 6,469,671 B1 concerns an array antenna comprising a plurality of radiofrequency radiant modules thermally coupled with a plane cooling element (cold plate), to which a support structure is coupled, in said support structure being possible inserting radiofrequency radiant modules, parallel each other.

In the above case, support structure permits containing each module within housing after its insertion and sliding within the same. However said patent does not describe a system for exerting a pressure on module in order to optimize module/cold plate thermal coupling. Moreover, modules do not have a coupling with a cooling element by said surfaces.

Another problem common to the above known devices is the once concerning installing distribution network of radiofrequency signals to said radiant modules. Said network is comprised of a plurality of circuits, preferably micro strip circuits, apt to distributing radiofrequency signal to the different radiant modules and it is known that it is very delicate. In fact, damaging of said network often occurs mainly during the following maintenance steps of the radiant modules, during which the whole support—housing—cooling device must be mounted again.

In view of the above, it is therefore object of the present invention that of overcoming the limits of the known technique, both permitting a high packing of radiant modules of an array antenna and maintaining a high flexibility in replacing even a single module.

It also object of the present invention that of permitting an assembling of modules within a support, housing and cooling device maintaining a preset and uniform pressure on a surface (preferably, but not only identified by the lower one) of the same transceiving module for an efficient cooling.

It is further object of the present invention that of permitting an optimum assembling of the support, housing and cooling device for transceiving modules with the distribution network of the radiofrequency signals to be transmitted.

It is therefore specific object of the present invention a device for supporting, housing and cooling radiant modules of an antenna, particularly an array antenna, comprising a plate for cooling said radiant modules that can be fixed to means for supporting said antenna, said plate having an upper surface and a lower surface; characterized in that it comprises a plurality of projecting guides provided at least on one of said surfaces of said plate, so that each pair of said projecting guides adjacent with surface on which are provided realize housing seats, in each one of which one of said radiant modules can be introduced; and pressing means, integrated with said projecting guides, apt exerting a pressure on said radiant modules so as to obtain a substantially uniform coupling between each of them and the surface of said plate on which said projecting guides are provided.

Always according to the invention, said device can comprise a plurality of projecting guides, both on said upper surface and on said lower surface of the plate, so as to permit realization of said housing seats of said radiant modules on both said plate surfaces.

Still according to the invention, said projecting guide can have a "T" shaped cross section.

Advantageously, according to the invention, each one of said projecting guide can have one or more through holes, wherein said pressing means are placed, said through holes having their axis substantially perpendicular to the surface of said plate.

Furthermore, according to the invention, said one or more through holes can be threaded inside and said pressing means provide a dowel, that can be screwed within one of said through holes, said dowel comprising inside elastic means and a sphere on which said elastic means act, said sphere permitting sliding of said radiant module during its insertion within said seat, and exerting a uniform and adjustable pressure on the same.

Always according to the invention, said one or more through holes of each one of said projecting guides can be obtained in the projecting portion of the same.

Still according to the invention, said elastic means can be comprised of a spring.

Preferably, according to the invention, said device can comprise a containment structure, fixed on the side opposite to the side where said radiant modules are housed, apt to house and insulate two networks, one network for distribution of radiofrequency signal to radiant modules, and a network for distribution of digital signals and of electric supply to radiant modules.

Furthermore, according to the invention, said processing circuit for signal can be placed in a seat of said plate and it is electrically connected with said radiofrequency signal distribution network, and with said digital signal distribution network and to electric supplies by suitable connectors.

Advantageously, according to the invention, each one of said radiant modules can comprise an envelope, within which a signal processing unit is provided, having a front end and a rear end and a pair of lateral fins suitable to enter within said projecting guide and on which said pressing means exert a pressure, a portion of wave guide or radiant mouth, fixed to said front end of said envelope, apt to receiving and transmitting radiofrequency signals, and a connector placed in correspondence of said rear end of said envelope, that can be connected with said radiofrequency signal distribution network.

Preferably, according to the invention, said device can comprise, for each radiant module, a connector, placed on the bottom of each seat coupable with the corresponding connector of the radiant module housed within said seat; a space, in correspondence of each seat and co-planar with respect to the same; and a radiofrequency cable, placed within said space, the ends of which are connected with said connector and with said radiofrequency signal distribution network.

Always according to the invention, said radiant modules can permit receiving and transmitting, event at the same time radiofrequency signals.

Still according to the invention, said plate can comprise one or more inner channels, for flow of a cooling liquid, and inlet and outlet openings for said cooling liquid.

Furthermore, according to the invention, said device can comprise a front protection cover provided on said radiant guides.

Advantageously, according to the invention, said plate can comprise flanges for fixing with said antenna support means.

It is further object of the present invention an array antenna comprising a support structure; a plurality of support, housing and cooling devices for radiant modules, each one coupable with said antenna support structure by said flanges so as to overlap each other, the radiant modules thus realizing a matrix radiant assembly.

Always according to the invention, said antenna can comprise cooling fluid pumping means coupled with said openings of each device.

The present invention will be now described, for illustrative but not limitative purposes, according to its preferred embodiments, with particular reference to the figures of the enclosed drawings, wherein.

Similar parts in the different figures will be indicated by the same references.

Figure 1:
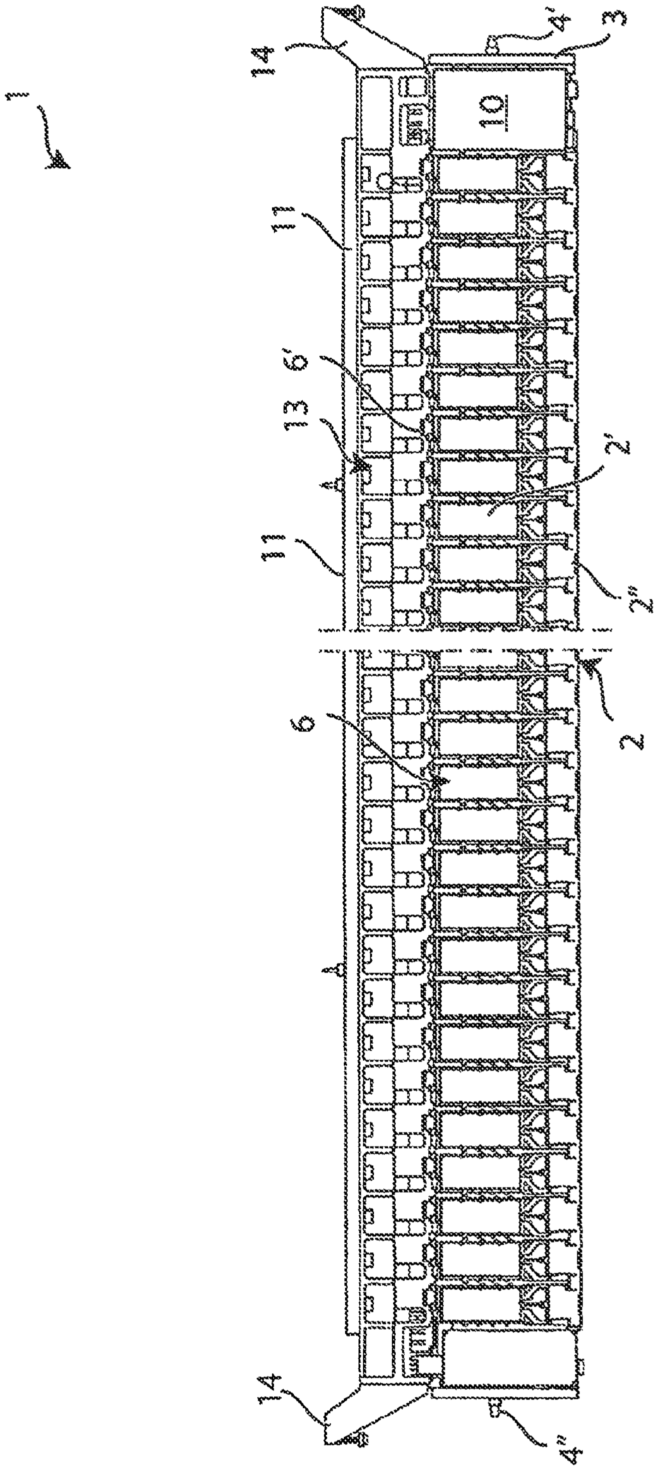
FIG. 1 shows a plan view of the support, housing and cooling device for radiant modules of an array antenna.
Figure 2:
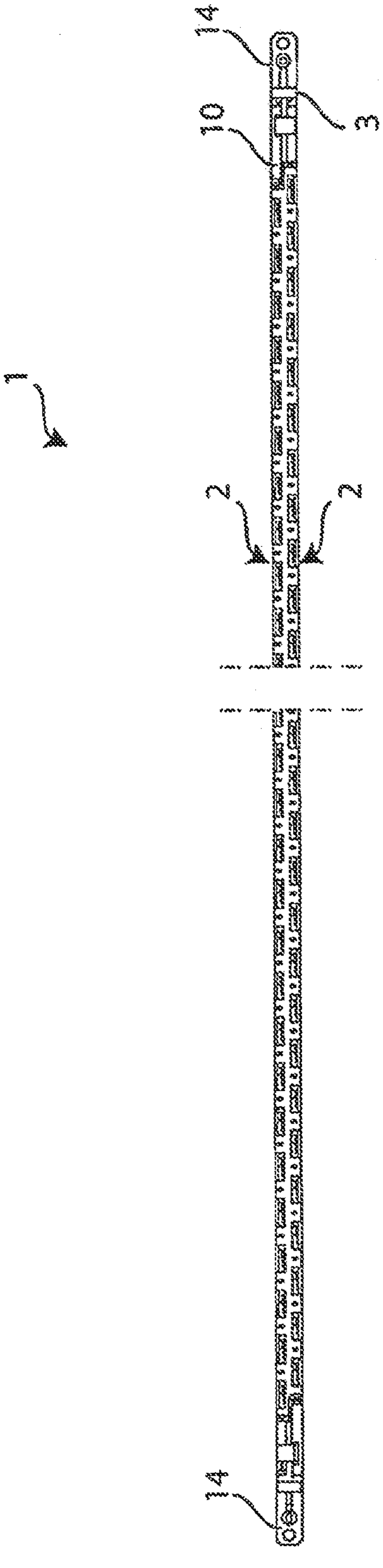
FIG. 2 is a front view of device of FIG. 1.
Figure 3:
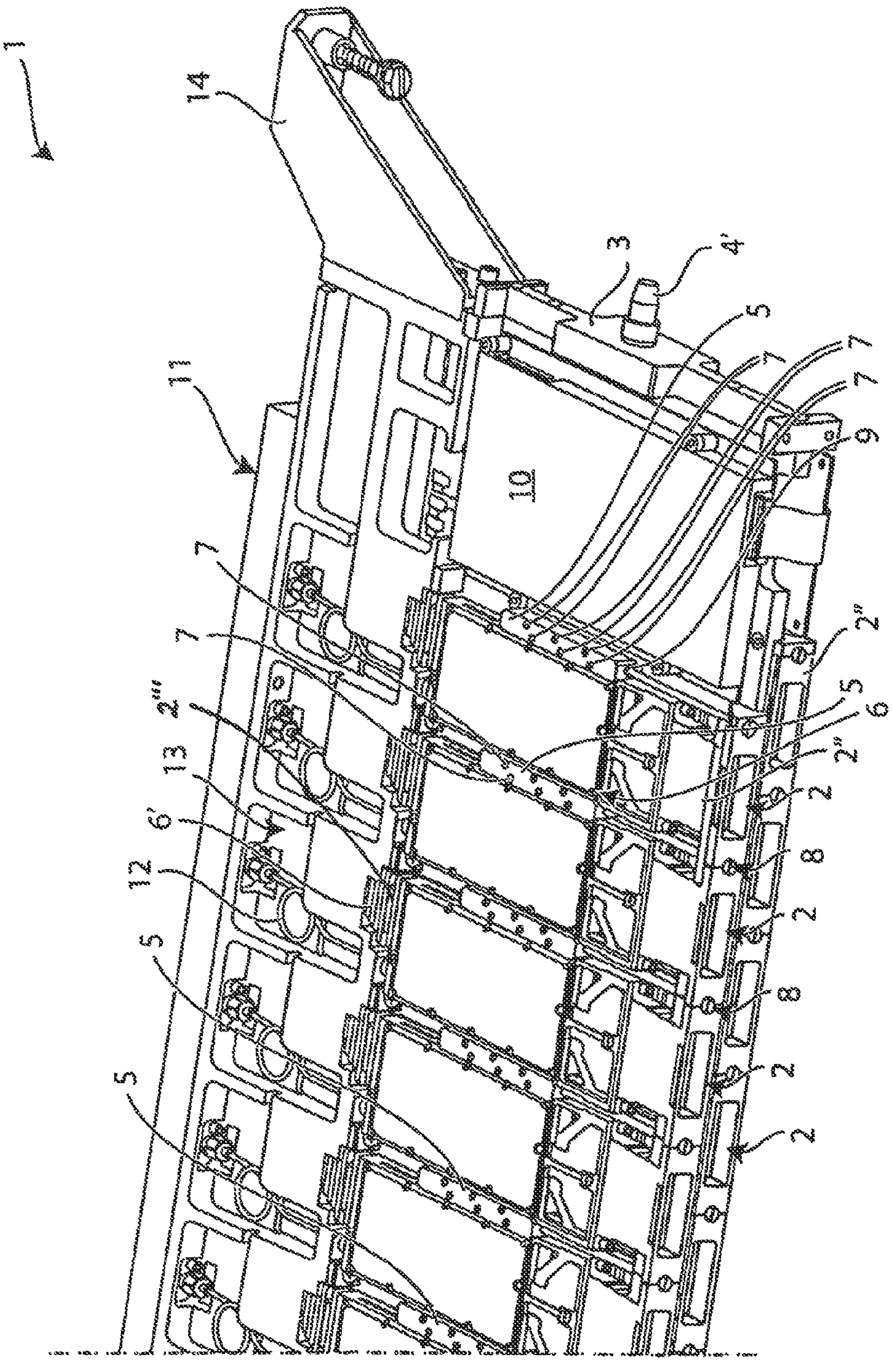
FIG. 3 is a perspective view of device of FIG. 1.

Making reference to FIGS. 1-3, it is shown a device 1 for supporting, housing and cooling radiant modules 2 of a planar type array antenna (not shown).

Device 1 comprises a plate 3 (cold plate) for housing and cooling said radiant modules 2, contacting its upper and lower surfaces, so that the assembly is along two juxtaposed parallel lines.

Openings 4', 4" are present at the ends of said plate 3 for inlet and outlet of a cooling liquid. Said liquid is circulated by a pumping system (not shown in the figures) within inner channels (not visible in these figures) toward said plate 3.

A plurality of projecting guides 5, parallel each other and with a "T" shape cross section is present on said upper and lower surface of said plate 3. Said projecting guides in pairs, along with the surface of the plate 3 on which they are provided, individuate a housing 6 within which it is possible introducing a single radiant module 2.

Each radiant module 2 comprises a signal processing portion within an envelope 2', generally comprised of metal, and a radiant guide 2", i.e. an open wave guide apt to irradiating the signal processed by said processing portion. When module 2 is introduced within housing 6, sides of envelope 2' are under said projecting guide 5. Particularly, said envelope 2' comprises fins (not visible in the present figure) suitable to enter under said projecting guides 5.

In order to ensure an optimum coupling of the envelope 2' surface of each radiant module 2 with the plate 3 surface, pressing means 7 are provided, integrated in said projecting guides 5, permitting exerting a pressure on said envelope 2' sides, and particularly on said fins.

Each radiant module 2, once introduced within a housing 6, is longitudinally blocked on said plate 3 by screws 8 fixing two radiant guides 2" of two adjacent radiant modules 2, screwing within a threaded hole 9 obtained on said projecting guides 5.

Said plate 3 also houses a signal processing circuit 10 necessary for control logic of said signal and a radiofrequency signal distribution network 11 for distribution to said radiant modules 2, known as Horizontal Beam Forming Network.

Each seat 6 is provided with a connector 6' on the bottom vertical wall that can be coupled with a corresponding connector 2" of the radiant module housed within the same.

Radiofrequency signal on said connector 6' is brought by a radiofrequency cable 12, placed within a space 13 corresponding to each seat 6, connected to the radiofrequency signal distribution network 11.

Finally, said device 1 also comprises flanges 14 for fixing to a support structure mounted within array antenna. A typical planar array antenna is comprised of a plurality of said devices 1, projecting juxtaposed each other, so as to realize a radiant plane.

Structure of device 1 described in the above permits a quick replacement even of a single failing radiant module 2. In fact, it is not necessary removing said cold plate 3 from the structure of antenna in order to extract a single radiant module 2'. A technician must only remove screws 8 fixing radiant guide 2" of the module 2 to be replaced, extract said radiant module 2 manually or acting on said radiant guide 2" by a suitable tool and inserting a new radiant module 2 between the projecting guides 5.

In order to reduce space between radiant modules 2, so as to improve total packing of antenna, each one of said screws 8 blocks a pair of adjacent modules 2 in position, i.e. is inserted through two adjacent radiant guides 2".

Figure 4:
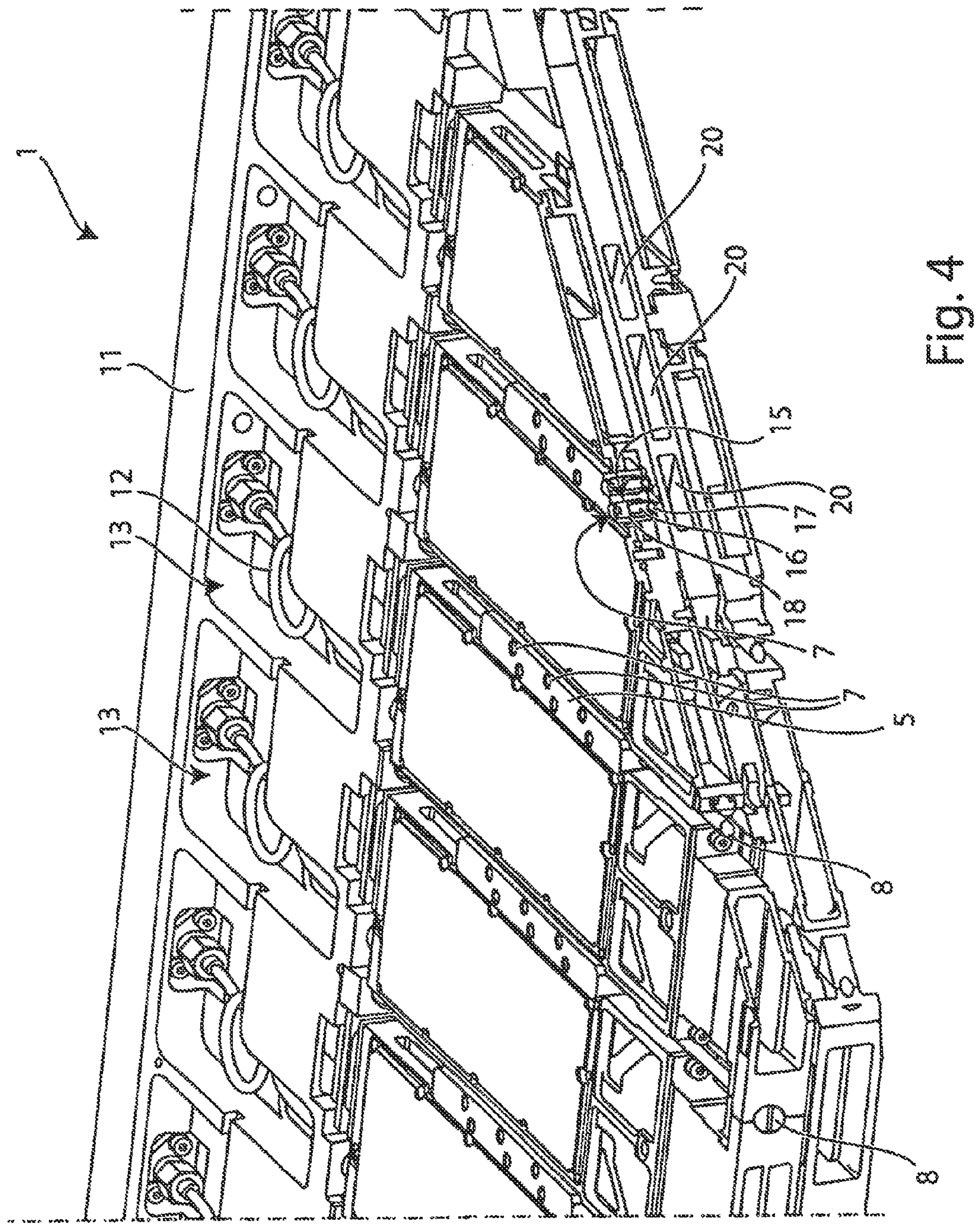
FIG. 4 shows an angulated section of device of FIG. 1.
Figure 5:
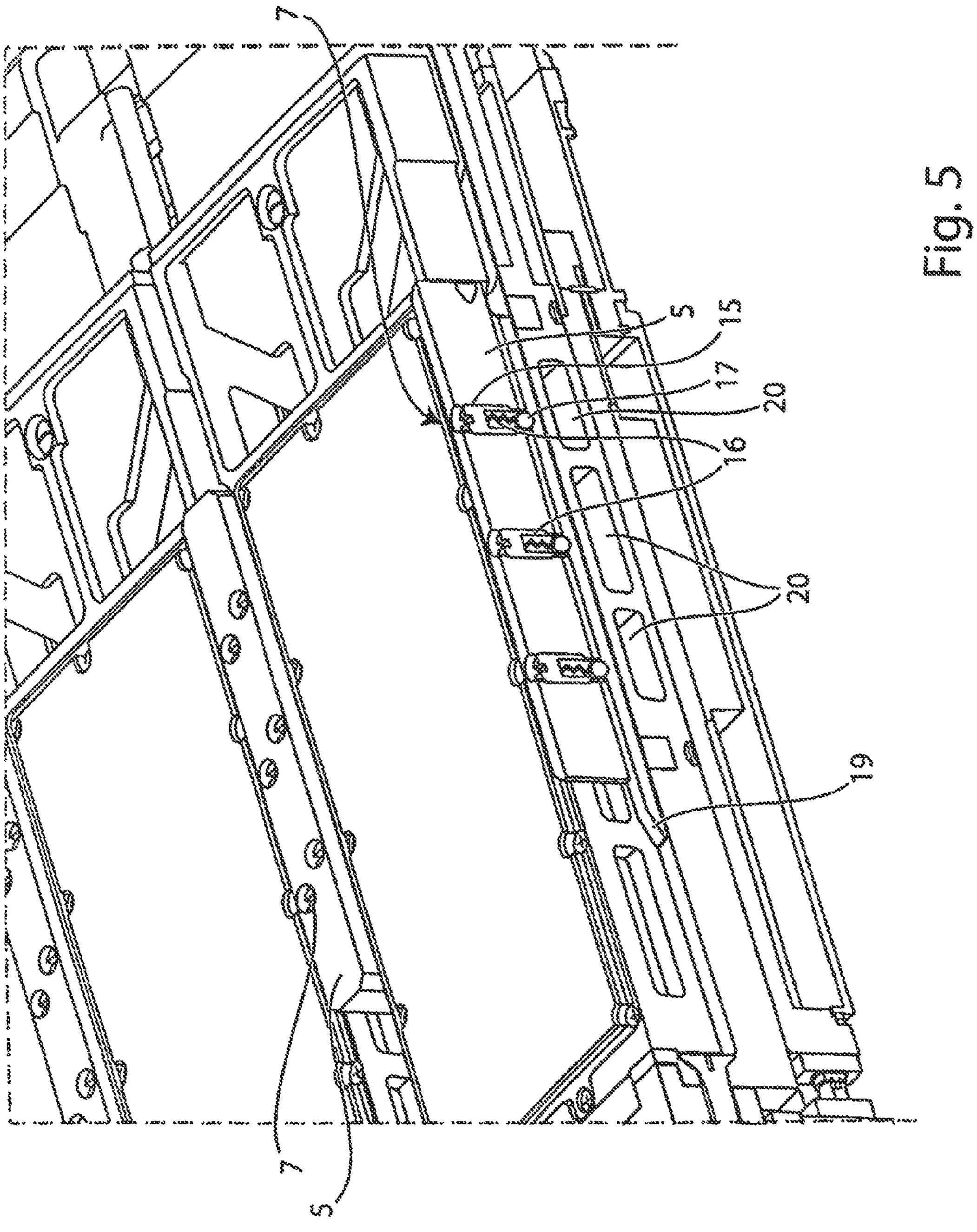
FIG. 5 shows a particular of the cross section of device of FIG. 1, wherein pressing means can be sees.
Figure 6:
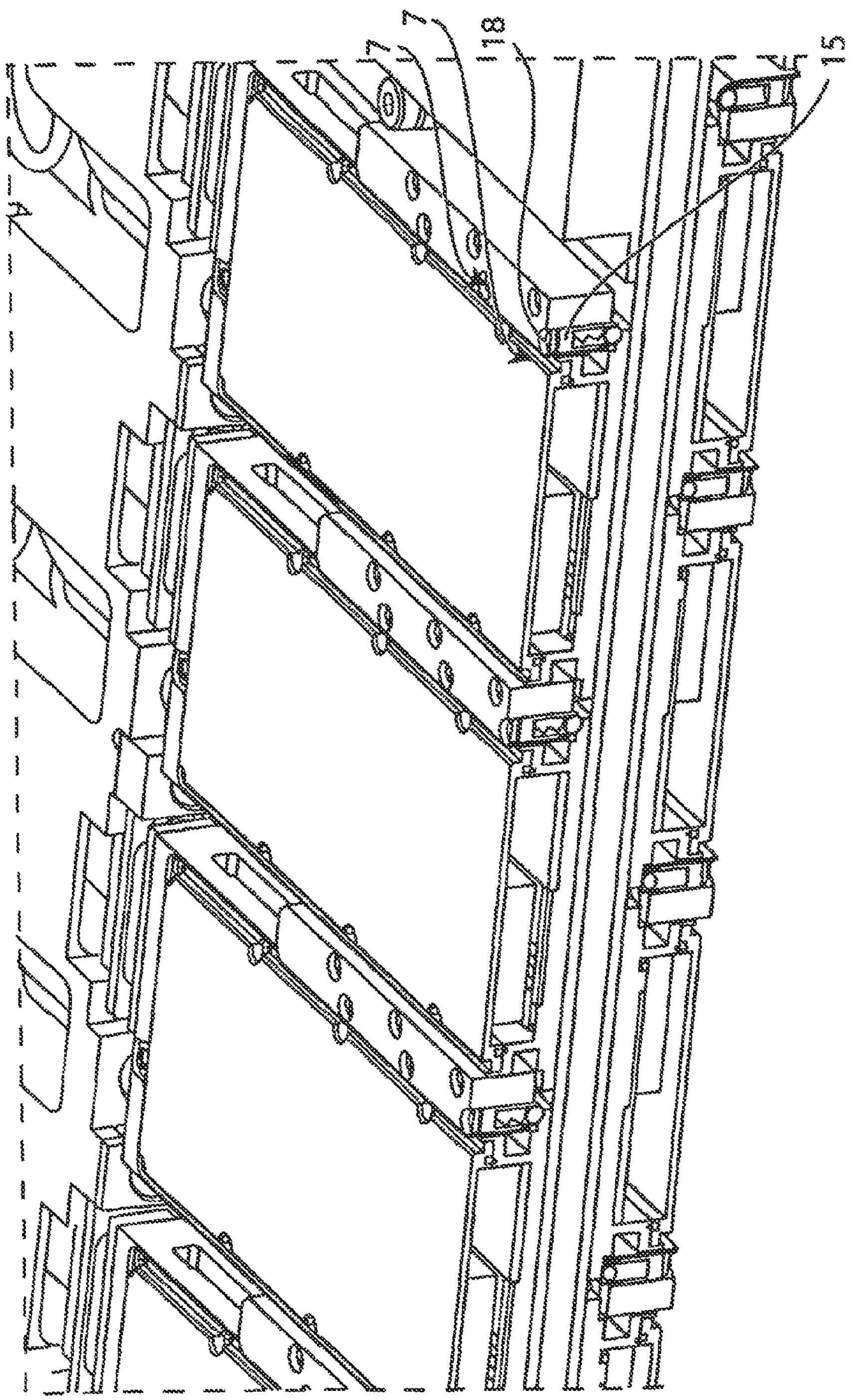
FIG. 6 shows a particular of longitudinal section of radiant part of device according to FIG. 1.

FIGS. 4-6 show section views of device 1, wherein it is possible observing pressing means 7. Each projecting guide 5 has one or more through holes 18, which are threaded inside and with their axis substantially perpendicular to the surface of said plate 3 (cold plate).

Pressing means 7 is comprised of a dowel 15, within which a spring 16 and a sphere 17 are present. Each one of said dowels 15 is inserted and screwed within a through hole 18. Spheres 17 of said dowels 15 exert a constant pressure on the lateral surface of said radiant module 2, and particularly of envelope 2', said pressure being easily adjustable by screwing of each dowel 15 within the hole 18. This permits exerting a higher pressure on the front portion of envelope 2' rather than on the rear portion of envelope 2', or vice versa, in order to permit a better dissipation of heat generated.

In FIG. 5 it is observed that each envelope 2' is laterally provided with a fin 19 on which spheres 17 exert a pressure. When inserting radiant module 2, spheres 17, rotating, permit an easy sliding of the same module.

Examining the figures, it is possible observing also cooling liquid flowing channels 20, suitably provided on said plat 3. It can be observed that pressing means 7 placed on projecting guides 5 are provided in correspondence of channels 20, thus permitting an optimum cooling of the same radiant modules.

In FIG. 5 it is also clearly possible observing fins 19, on which pressing means exert a pressure, keeping module 2 in proper position.

Figure 7:
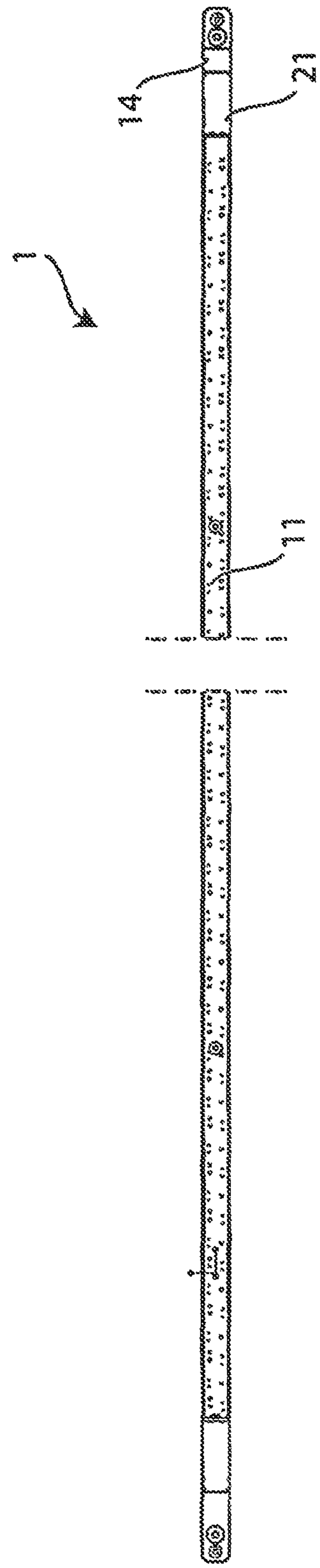
FIG. 7 shows a rear view of support, housing and cooling device for radiant modules of an array antenna.
Figure 8:
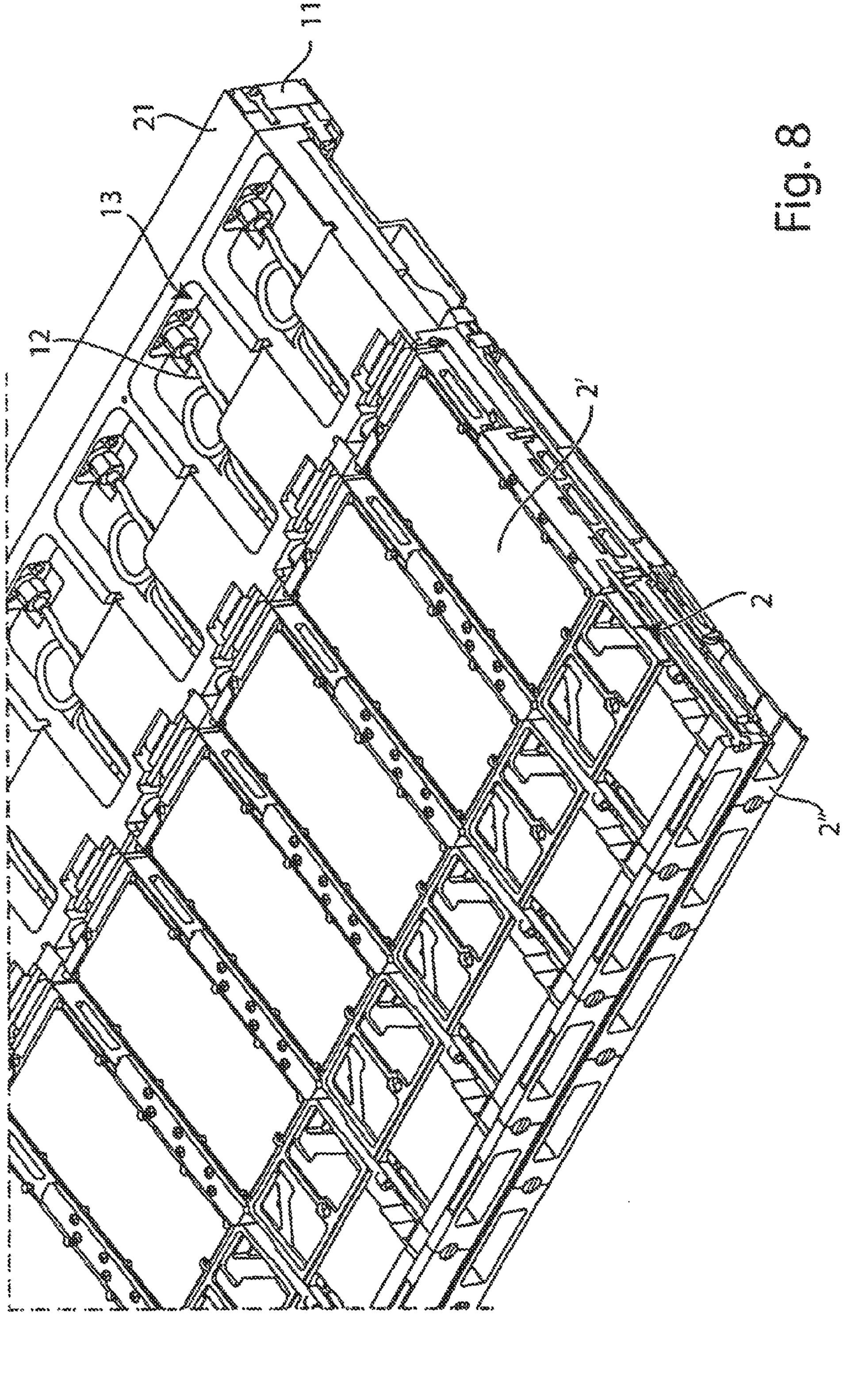
FIG. 8 shows a further perspective view of device of FIG. 1.

Making now reference to FIGS. 7 and 8, it is possible observing a containment structure 21 fixed to the plate 3 (cold plate) in the rear portion of device 1, wherein it is provided a digital signal and electric supply distribution network 22, comprising printed circuits necessary for distribution of said signals and supply toward radiant modules 2.

Containment structure 21, beside housing said radiofrequency signal distribution network 11, permits it radiofrequency insulation.

As it can be observed, total assembly comprised of plate 3, radiant modules 2 and radiofrequency signal distribution network 11 realized by device 1 is really compact and permits a high packing of radiant modules 2.

On the front side, a protection cover is mounted on radiant guides.

An advantage of the present invention is that of permitting a reduction of time necessary to replace radiant modules, permitting few and simple mechanical operations, such as particularly, dismounting of the sole antenna front cover. This permits ensuring to the active antenna, of which the different support, housing and cooling devices according to the invention are integral part, full performance conditions, easily and quickly replacing failing transmitting modules.

The present invention has been described for illustrative but not limitative purposes, according to its preferred embodiments, but it is to be understood that modifications and/or changes can be introduced by those skilled in the art without departing from the relevant scope as defined in the enclosed claims.

The invention claimed is:

1. A device (1) for supporting, housing and cooling radiant modules (2) of an antenna, comprising a plate (3) for cooling said radiant modules (2) that is configured to be fixed to a means for supporting said antenna, said plate (3) having an upper surface and a lower surface;

a plurality of projecting guides (5) provided at least on one of said surfaces of said plate (3), so that each pair of said projecting guides (5) adjacent with the one of said surfaces on which are provided realize housing seats (6), in each one of which a respective one of said radiant modules (2) is introduced;

a pressing means (7, 15, 16, 17), integrated with said projecting guides (5), configured for exerting a pressure on said radiant modules (2) so as to obtain a substantially uniform coupling between each of said radiant modules (2) and the one of said surfaces of said plate (3) on which said projecting guides (5) are provided;

characterized in that each one of said projecting guides (5) has a plurality of through holes (18), wherein said pressing means (7, 15, 16, 17) are placed in the through holes (18), each one of said through holes (18) having an axis substantially perpendicular to the one of said surfaces of said plate (3); and each one of said through holes (18) being threaded inside, and said pressing means (7) provided with a dowel (15), that is configured to be screwed within a corresponding one of said through holes (18), said dowel (15) comprising an inside elastic means (16) and a sphere (17) on which said elastic means (16) acts, said sphere (17) permitting sliding of said respective one of said radiant modules (2) during insertion of said respective one of radiant modules within a corresponding one of said seats (6), and exerting a uniform and adjustable pressure on said respective one of said radiant modules.

2. The device (1) according to claim 1, characterized in that it comprises a second plurality of projecting guides (5), on another of said upper surface and on said lower surface of the plate (3), so as to permit realization of a second plurality of said housing seats (6) configured for said radiant modules (2) on said another of said upper surface and on said lower surface of said plate (3).

3. The device (1) according to claim 1, characterized in that each of said projecting guides (5) have a "T" shaped cross section.

4. The device (1) according to claim 1, characterized in that each of said through holes (18) of each one of said projecting guides (5) is obtained in a projecting portion of each one of said projecting guides (5).

5. The device (1) according to claim 1, characterized in that said elastic means is comprised of a spring (16).

6. The device (1) according to claim 1, characterized in that it comprises a containment structure (21), fixed on a side of the device (1) opposite to a side where said radiant modules (2) are housed, the containment structure (21) apt to house and insulate a network (11) for distribution of radiofrequency signal to said radiant modules (2), and a network (22) for distribution of digital signals and of electric supply to said radiant modules (2).

7. The device (1) according to claim 6, characterized in that a processing circuit for signal (10) is placed in a processing circuit seat of said plate (3) and the processing circuit (10) is electrically connected with said network (11) for distribution of radiofrequency signals, and with said network (22) for distribution of digital signals and of an electric supply by suitable connectors.

8. The device (1) according to claim 1, characterized in that each one of said radiant modules (2) comprises:

an envelope (2'), within which a signal processing unit is provided, having a front end and a rear end and a pair of lateral fins (19) suitable to enter within a corresponding pair of said projecting guides (5) and on which each of said pressing means (7) exerts a pressure, a portion of a wave guide or radiant mouth (2"), fixed to said front end of said envelope (2'), apt to receiving and transmitting radiofrequency signals, and a radiant module connector (2'") placed in correspondence of said rear end of said envelope (2'), that is configured to be connected with a network (11) for distribution of radiofrequency signal.

9. The device (1) according to claim 8, characterized in that each one of said radiant modules (2) comprises:

a radiofrequency signal connector (6'), placed on the bottom of each of said seats (6) coupleable with the corresponding radiant module connector (2'") of each one of the radiant modules (2) housed within each of said seats (6);

a space (13), in correspondence of each of said seats (6) and co-planar with respect to of said seats (6); and a radiofrequency cable (12), placed within said space (13), a first end of the radio frequency cable (12) being connected with said radiofrequency signal connector (6') and a second end of the radiofrequency cable (12) being connected with said network (11) for distribution of radiofrequency signal.

10. The device (1) according to claim 1, characterized in that said radiant modules (2) permit receiving and transmitting radiofrequency signals.

11. The device (1) according to claim 1, characterized in that said plate (3) comprises:

one or more inner channels (20), for flow of a cooling liquid, and inlet and outlet openings (4', 4") for said cooling liquid.

12. The device (1) according to claim 8, characterized in that it comprises a front protection cover provided on said wave guide or radiant mouth (2").

13. The device (1) according to claim 11, characterized in that said plate (3) comprises flanges (14) for fixing with said means for supporting said antenna.

14. An array antenna comprising:

a support structure including a means for supporting said antenna;

a plurality of support, housing and cooling devices (1) for radiant modules (2) as defined in claim 13, each one of said plurality of support, housing and cooling devices (1) coupleable with said support structure by said flanges (14) so as to overlap each other, the radiant modules (2) thus providing a matrix radiant assembly.

15. The antenna according to claim 14, characterized in that it comprises a cooling fluid pumping means coupled with said inlet and outlet openings (4', 4") of each of said support, housing and cooling devices (1).

* * * * *